United States Patent
Otsuka et al.

(10) Patent No.: US 12,427,551 B2
(45) Date of Patent: Sep. 30, 2025

(54) FILTER CLEANING SYSTEM AND FILTER CLEANING METHOD

(71) Applicant: Tokyo Electron Limited, Tokyo (JP)

(72) Inventors: Yuki Otsuka, Kumamoto (JP); Atsushi Anamoto, Kumamoto (JP); Hiroshi Komiya, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 430 days.

(21) Appl. No.: 17/796,014

(22) PCT Filed: Jan. 27, 2021

(86) PCT No.: PCT/JP2021/002751
§ 371 (c)(1),
(2) Date: Jul. 28, 2022

(87) PCT Pub. No.: WO2021/157440
PCT Pub. Date: Aug. 12, 2021

(65) Prior Publication Data
US 2023/0091875 A1    Mar. 23, 2023

(30) Foreign Application Priority Data

Feb. 5, 2020   (JP) ................. 2020-018170

(51) Int. Cl.
*B08B 3/14*        (2006.01)
*B01D 29/66*       (2006.01)
(Continued)

(52) U.S. Cl.
CPC ............... *B08B 3/14* (2013.01); *B01D 29/66* (2013.01); *B08B 3/08* (2013.01); *B08B 13/00* (2013.01);
(Continued)

(58) Field of Classification Search
CPC .. B08B 3/14; B08B 3/08; B08B 13/00; B08B 2203/007; B01D 29/66; B01D 29/62;
(Continued)

(56) References Cited

U.S. PATENT DOCUMENTS 3,654,148 A * 4/1972 Bradley ............... B01D 61/026
                                                       210/257.2
4,254,699 A * 3/1981 Skinner ..................... B02B 1/04
                                                       366/307
(Continued)

FOREIGN PATENT DOCUMENTS

CN        103567110 A  *  2/2014  ........ B01D 19/0031
JP        2012223669 A     11/2012
(Continued)

OTHER PUBLICATIONS

English translation of Patent Publication CN 103567110A, published Feb. 12, 2014. (Year: 2014).*
(Continued)

*Primary Examiner* — Joseph W Drodge
(74) *Attorney, Agent, or Firm* — Venjuris, P.C.

(57) ABSTRACT

A filter cleaning system includes a storage unit that stores liquid that is passed through a filter; a liquid supply path that sends the liquid stored in the storage unit to the filter; a circulation path that returns the liquid sent from the filter to the storage unit; a first supply unit that supplies a first liquid to the storage unit; and a second supply unit that supplies a second liquid having a surface tension lower than that of the first liquid and an affinity for the first liquid, to the storage unit.

9 Claims, 10 Drawing Sheets

(51) Int. Cl.
    *B08B 3/08*   (2006.01)
    *B08B 13/00*  (2006.01)
    *H01L 21/67*  (2006.01)

(52) U.S. Cl.
    CPC ... *B08B 2203/007* (2013.01); *H01L 21/67017* (2013.01)

(58) Field of Classification Search
    CPC ...... B01D 29/88; B01D 29/885; B01D 65/02; B01D 65/06; B01D 2221/14; H01L 21/67017; H01L 21/304
    See application file for complete search history.

(56) References Cited

U.S. PATENT DOCUMENTS

| | | | | |
|---|---|---|---|---|
| 4,381,703 A | * | 5/1983 | Crimmins | B01F 27/90 |
| | | | | 99/518 |
| 5,035,799 A | * | 7/1991 | Rosberg | B01D 29/66 |
| | | | | 210/411 |
| 5,498,349 A | * | 3/1996 | Kurahashi | B01D 29/606 |
| | | | | 210/411 |
| 6,159,373 A | * | 12/2000 | Beck | B01D 29/6438 |
| | | | | 210/636 |
| 6,280,300 B1 | * | 8/2001 | Komatsu | B01D 61/14 |
| | | | | 451/87 |

FOREIGN PATENT DOCUMENTS

| | | | | | |
|---|---|---|---|---|---|
| JP | 2013-175552 A | | 9/2013 | | |
| JP | 2015103662 A | | 6/2015 | | |
| JP | 2017-055023 A | | 3/2017 | | |
| KR | 20190055731 A | * | 5/2019 | ....... | H01L 21/67253 |
| WO | WO-2018128088 A1 | * | 7/2018 | ........... | H01L 21/304 |
| WO | WO-2019064565 A1 | * | 4/2019 | ............. | B01D 29/25 |

OTHER PUBLICATIONS

English translation of Patent Publication WO 2018128088A1, published Jul. 12, 2018. (Year: 2018).*
English translation of Publication WO 2019064565A1, published Apr. 4, 2019. (Year: 2019).*
English translation of Patent Publication KR 20190055731A, published May 23, 2019. (Year: 2019).*
International Search Report issued on Apr. 6, 2021 for WO 2021/157440 A1 (4 pages).

* cited by examiner

FILTER CLEANING SYSTEM AND FILTER CLEANING METHOD

CROSS REFERENCE TO RELATED APPLICATIONS

This application is a national phase of PCT application No. PCT/JP2021/002751, filed on 27 Jan. 2021, which claims priority from Japanese patent application No. 2020-018170, filed on 5 Feb. 2020, all of which are incorporated herein by reference.

TECHNICAL FIELD

The present disclosure relates to a filter cleaning system and a filter cleaning method.

BACKGROUND

In the related art, a substrate liquid processing apparatus that performs a liquid processing on a substrate such as a semiconductor wafer includes a filter in a supply path of a processing liquid in order to remove foreign substances included in the processing liquid.

As a technique for cleaning a filter, Patent Document 1 discloses a method for cleaning a supply path and a filter by alternately supplying high-temperature pure water and low-temperature pure water to the supply path.

PRIOR ART DOCUMENT

Patent Document

Patent Document 1: Japanese Laid-Open Patent Publication No. 2017-055023

SUMMARY OF THE INVENTION

Problem to be Solved

The present disclosure provides a technique capable of effectively cleaning a filter before being used in a substrate liquid processing apparatus.

Means to Solve the Problem

A filter cleaning system according to an aspect of the present disclosure includes a storage unit, a liquid supply path, a circulation path, a first supply unit, and a second supply unit. The storage unit stores liquid that is passed through a filter. The liquid supply path sends the liquid stored in the storage unit to the filter. The circulation path returns the liquid sent from the filter to the storage unit. The first supply unit supplies a first liquid to the storage unit. The second supply unit supplies a second liquid having a surface tension lower than that of the first liquid and an affinity for the first liquid to the storage unit.

Effect of the Invention

According to the present disclosure, it is possible to effectively clean a filter before being used in a substrate liquid processing apparatus.

DETAILED DESCRIPTION TO EXECUTE THE INVENTION

Figure 1:
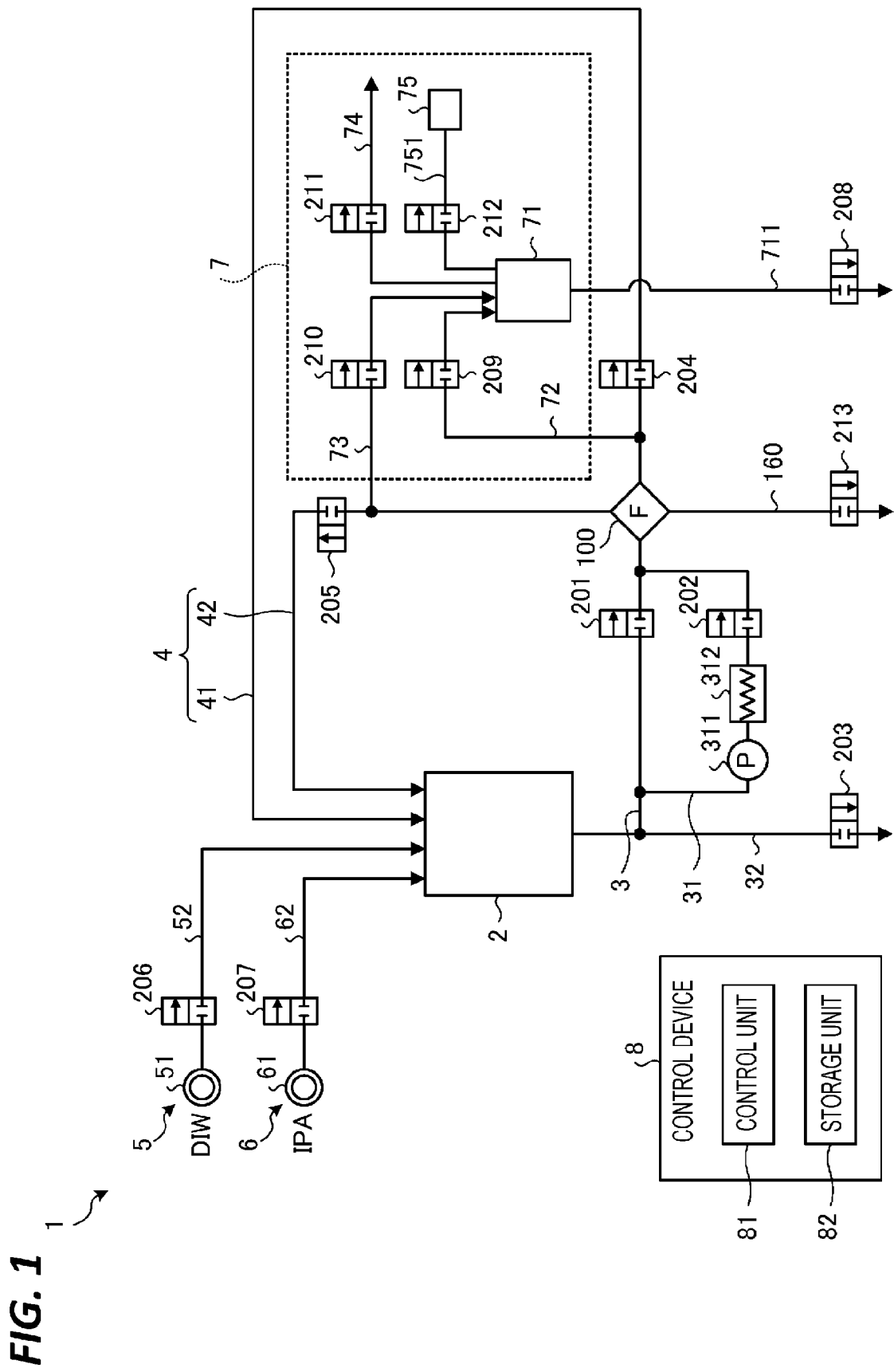
FIG. 1 is a view illustrating a configuration of a filter cleaning system according to an embodiment.

Hereinafter, embodiments for implementing a filter cleaning system and a filter cleaning method according to the present disclosure (hereinafter, referred to as "embodiments") will be described in detail with reference to the drawings. The present disclosure is not limited to the embodiments. Further, each embodiment may be appropriately combined as long as the processing contents do not contradict each other. Further, in each of the following embodiments, the same portions are denoted by the same reference numerals, and duplicate descriptions are omitted.

Further, in the embodiments illustrated below, expressions such as "constant," "orthogonal," "vertical," or "parallel" may be used. However, these expressions do not require to be strictly "constant," "orthogonal," "vertical," or "parallel". That is, each of the above expressions allows for deviations in, for example, manufacturing accuracy and installation accuracy.

Further, in each drawing referred to below, in order to make the explanation easy to understand, an orthogonal coordinate system may be illustrated in which the X-axis direction, the Y-axis direction, and the Z-axis directions which are orthogonal to each other are defined, and the Z-axis positive direction is defined as the vertical upward direction. Further, a rotation direction centered on the vertical axis may be referred to as a θ direction.

First Embodiment

[Configuration of Filter Cleaning System]

Figure 2:
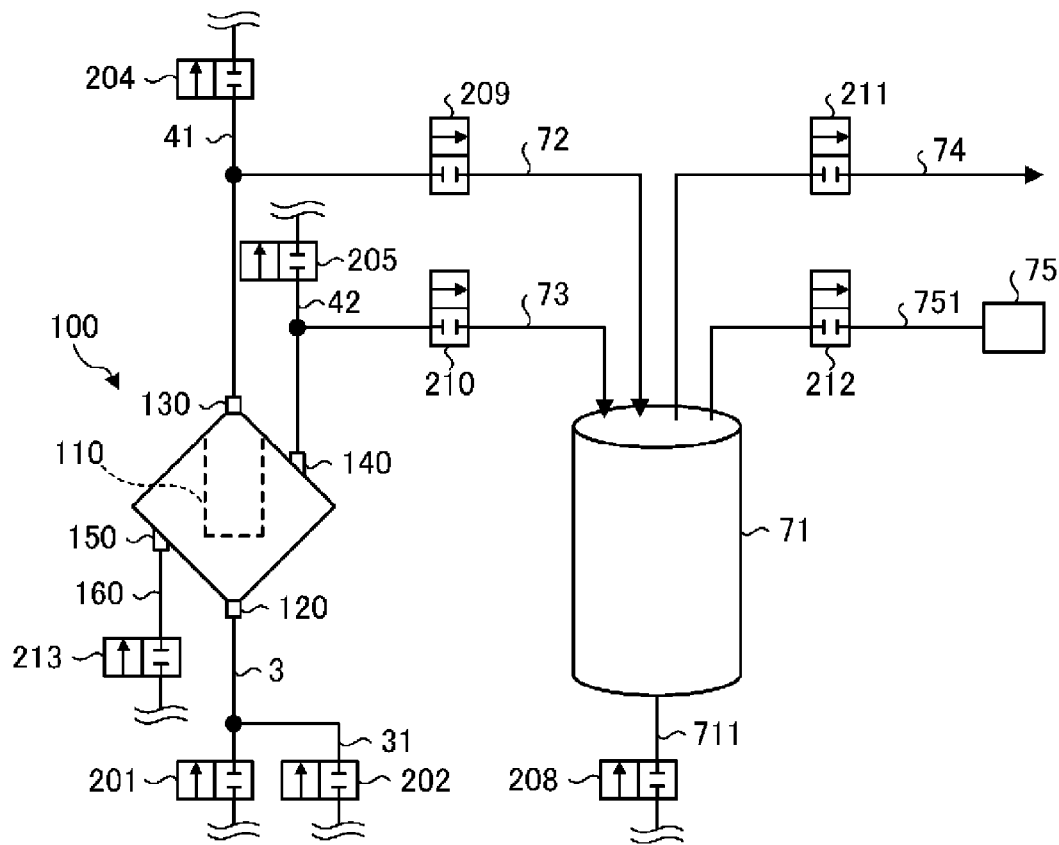
FIG. 2 is a view illustrating an example of a configuration of a filter and a decompression mechanism.

First, a configuration of a filter cleaning system according to a first embodiment will be described with reference to FIGS. 1 and 2. FIG. 1 is a view illustrating the configuration of the filter cleaning system according to the embodiment. FIG. 2 is a view illustrating an example of a configuration of a filter and a decompression mechanism.

A filter cleaning system 1 according to the first embodiment illustrated in FIG. 1 performs the cleaning of a filter 100. In the first embodiment, the filter 100 is a new product (unused product).

Before a substrate liquid processing apparatus in which the filter 100 is mounted is operated, the new filter 100 is necessary to be in a state where a filtration membrane 110 (see FIG. 2) provided inside the filter 100 is sufficiently wet so that liquid can circulate appropriately.

The filter 100 does not necessarily have to be new, and may be, for example, a filter (reused product) that is used in the past in another substrate liquid processing apparatus.

As illustrated in FIG. 1, the filter cleaning system 1 includes a storage unit 2, a liquid supply path 3, a circulation path 4, a first supply unit 5, a second supply unit 6, a decompression mechanism 7, and a control device 8. The filter cleaning system 1 may include the filter 100. Further, the filter cleaning system 1 may be a part of the substrate liquid processing apparatus.

The storage unit 2 is, for example, a tank, and stores liquid passed through the filter 100. The liquid supply path 3 is a conduit that connects a primary side of the filter 100 and the storage unit 2. Specifically, one end of the liquid supply path 3 is connected to a bottom portion of the storage unit 2, and the other end is connected to an introducing port 120 (see FIG. 2) provided on the primary side of the filter 100. A valve 201 that opens/closes the liquid supply path 3 is provided in the liquid supply path 3. The primary side of the filter 100 refers to a portion of the filter 100 upstream from the filtration membrane 110.

A bypass path 31 is provided in the liquid supply path 3. One end of the bypass path 31 is connected to the liquid supply path 3 on the upstream side from the valve 201, and the other end thereof is connected to the liquid supply path 3 on the downstream side from the valve 201. A pump 311, a heating unit 312 that heats the liquid circulating to the bypass path 31, and a valve 202 that opens/closes the bypass path 31 are provided in the bypass path 31.

Further, a drain path 32 is connected to the liquid supply path 3. The drain path 32 is connected to the liquid supply path 3 on the upstream side from the bypass path 31. A valve 203 that opens/closes the drain path 32 is provided in the drain path 32. The drain path 32 is used, for example, when the liquid inside the storage unit 2 is discharged.

The circulation path 4 is a conduit that connects a secondary side of the filter 100 and the storage unit 2. Specifically, the circulation path 4 includes a first circulation path 41 and a second circulation path 42. The first circulation path 41 is connected to a sending port 130 (see FIG. 2) provided on the secondary side of the filter 100. Further, the second circulation path 42 is connected to a vent port 140 (see FIG. 2) provided on the secondary side of the filter 100. The vent port 140 is used, for example, when air bubbles are discharged from the inside of the filter 100.

A valve 204 that opens/closes the first circulation path 41 is provided in the first circulation path 41. Further, a valve 205 that opens/closes the second circulation path 42 is provided in the second circulation path 42.

The first supply unit 5 supplies deionized water (DIW), which is an example of the first liquid, to the storage unit 2. The temperature of the DIW is not adjusted, and the temperature thereof is, for example, room temperature (e.g., approximately 23° C. to 25° C.).

The first supply unit 5 includes a DIW supply source 51, a first supply path 52 that connects the DIW supply source 51 and the storage unit 2 with each other, and a valve 206 that is provided in the first supply path 52 and opens/closes the first supply path 52. The DIW supply source 51 pumps DIW to the first supply path 52 using a pump (not illustrated). The DIW pumped by the DIW supply source 51 is supplied to the storage unit 2 via the first supply path 52 and is stored in the storage unit 2.

The DIW can remove metal components among the pollutants contained in the filter 100. Among the pollutants contained in the filter 100, the metal components are substances that are difficult to be removed (almost insoluble in IPA) by IPA supplied from the second supply unit 6 (to be described later).

The second supply unit 6 supplies isopropyl alcohol (IPA), which is an example of the second liquid, to the storage unit 2. The temperature of the IPA is not adjusted, and the temperature thereof is, for example, room temperature (e.g., approximately 23° C. to 25° C.). That is, the temperature of the IPA is equal to the temperature of the DIW supplied from the first supply unit 5.

The second supply unit 6 includes an IPA supply source 61, a second supply path 62 that connects the IPA supply source 61 and the storage unit 2 with each other, and a valve 207 that is provided in the second supply path 62 and opens/closes the second supply path 62. The IPA supply source 61 pumps IPA to the second supply path 62 using a pump (not illustrated). The IPA pumped by the IPA supply source 61 is supplied to the storage unit 2 via the second supply path 62 and is stored in the storage unit 2.

The IPA can mainly remove substances except the metal components among the pollutants contained in the filter 100. The metal components are not completely insoluble in IPA, but are dissolved in an extremely small amount. Therefore, if the metal components are not appropriately removed, when the apparatus is operated, the metal components may be dissolved from the filter 100 little by little for a long period of time, and thus, the processing liquid may be continuously contaminated.

Figure 3:
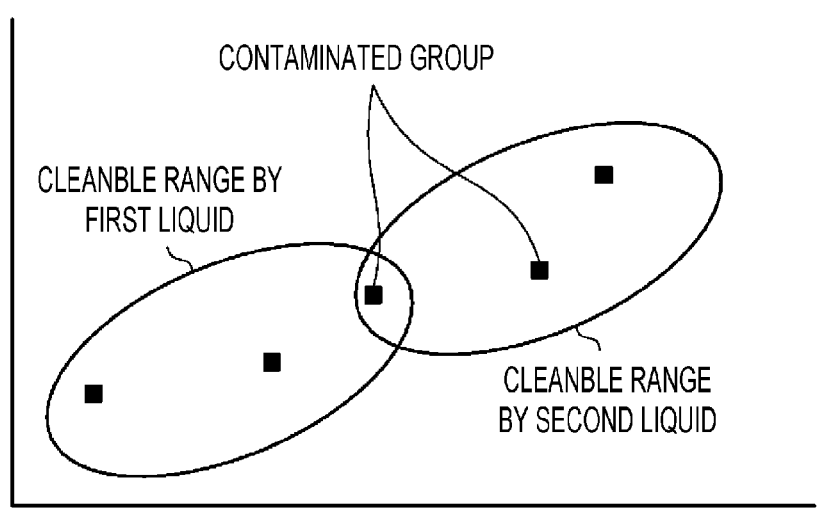
FIG. 3 is a graph illustrating a relationship between a cleanable range by a first liquid and a cleanable range by a second liquid.

FIG. 3 is a graph illustrating a relationship between a cleanable range by the first liquid and a cleanable range by the second liquid. As illustrated in FIG. 3, the cleanable range by the first liquid (e.g., DIW) and the cleanable range by the second liquid (e.g., IPA) may be partially overlapped with each other, but most of them are separated from each other. As described above, in the filter cleaning system 1, the first liquid and the second liquid having a positional relationship opposite to each other in the cleanable range (cleaning capability) with respect to the contaminated group, which is the cleaning target, are selected. Therefore, the contaminated group (e.g., metal components) that is difficult to be removed by only the second liquid can be removed by the first liquid, and the contamination by the contaminated group may be suppressed.

Specifically, as the second liquid, a liquid that has a low surface tension and an affinity for the first liquid (a property that is miscible with the first liquid) so as to wet the filtration membrane 110 is selected. Further, as the first liquid, a liquid that can properly remove the contaminated group that is difficult to be removed by the second liquid is selected. The indexes for selecting the first liquid and the second liquid are, for example, an HSP value (Hansen solubility parameter), a dielectric constant, and a diffusion coefficient, and differ depending on the contaminated group, which is the cleaning target.

The decompression mechanism 7 is connected to the circulation path 4, and decompresses the inside of the filter 100 via the circulation path 4. Specifically, the decompression mechanism 7 includes a tank 71, branch paths 72 and 73, an atmospheric open path 74, and an exhaust device 75.

The tank 71 stores a liquid (IPA or DIW). A drain path 711 that discharges the liquid stored in the tank 71 is connected to the tank 71. A valve 208 that opens/closes the drain path 711 is provided in the drain path 711.

The branch path 72 is a conduit that connects the first circulation path 41 and the tank 71 with each other. Specifically, one end of the branch path 72 is connected to the first circulation path 41 at the downstream from the filter 100 and at the upstream from the valve 204. Further, the other end of the branch path 72 is connected to the upper portion of the tank 71. A valve 209 that opens/closes the branch path 72 is provided in the branch path 72.

The branch path 73 is a conduit that connects the second circulation path 42 and the tank 71 with each other. Specifically, one end of the branch path 73 is connected to the second circulation path 42 between the filter 100 and the valve 205. Further, the other end of the branch path 73 is connected to the upper portion of the tank 71. A valve 210 that opens/closes the branch path 73 is provided in the branch path 73.

The atmospheric open path 74 is connected to the upper portion of the tank 71. A valve 211 that opens/closes the atmospheric open path 74 is provided in the atmospheric open path 74.

The exhaust device 75 is, for example, a vacuum pump, and is connected to the tank 71 via an exhaust path 751. The exhaust path 751 is connected to the upper portion of the tank 71. A valve 212 that opens/closes the exhaust path 751 is provided in the exhaust path 751.

Here, a configuration of the filter 100 will be described. As illustrated in FIG. 2, the filter 100 includes the filtration membrane 110 inside thereof. The filtration membrane 110 includes, for example, a polytetrafluoroethylene (PTFE) film. The PTFE film is hydrophobic.

On the primary side of the filter 100, the introducing port 120, the vent port 140, and a drain port 150 are provided. The liquid supply path 3 is connected to the introducing port 120. The second circulation path 42 is connected to the vent port 140. The vent port 140 is used, for example, to remove air bubbles from the inside of the filter 100. A drain path 160 is connected to the drain port 150. A valve 213 that opens/closes the drain path 160 is provided in the drain path 160. The drain path 160 is used, for example, when the liquid is discharged from the filter 100.

On the secondary side of the filter 100, the sending port 130 is provided. The first circulation path 41 is connected to the sending port 130.

The filter 100 is installed in a state where the primary side faces downward, and the secondary side faces upward. Therefore, the liquid (IPA or DIW) is introduced to the filter 100 from below.

Further, the filter 100 is disposed at a position lower than the liquid level of the liquid (IPA or DIW) stored in the storage unit 2 (see FIG. 1). Therefore, in the filter cleaning system 1, the liquid (IPA or DIW) stored in the storage unit 2 may be supplied to the filter 100 by using the own weight of the liquid.

As illustrated in FIG. 1, the filter cleaning system 1 further includes a control device 8. The control device 8 controls the operation of the filter cleaning system 1. The control device 8 is, for example, a computer, and includes a control unit 81 and a storage unit 82. The control unit 81 includes a microcomputer including a central processing unit (CPU), a read only memory (ROM), a random access memory (RAM), or an input/output port, and various circuits. The CPU of the microcomputer reads and executes a program stored in the ROM to implement control (to be described later). Further, the storage unit 82 is realized by, for example, a semiconductor memory element such as a RAM or a flash memory, or a storage device such as a hard disk or an optical disk.

The program may be recorded in a recording medium readable by a computer, and may be installed in the storage unit of the control device 8 from the recording medium. The recording medium readable by a computer include, for example, a hard disk (HD), a flexible disk (FD), a compact disk (CD), a magnet optical disk (MO), and a memory card.

[Specific Operation of Filter Cleaning System]

Figure 4:
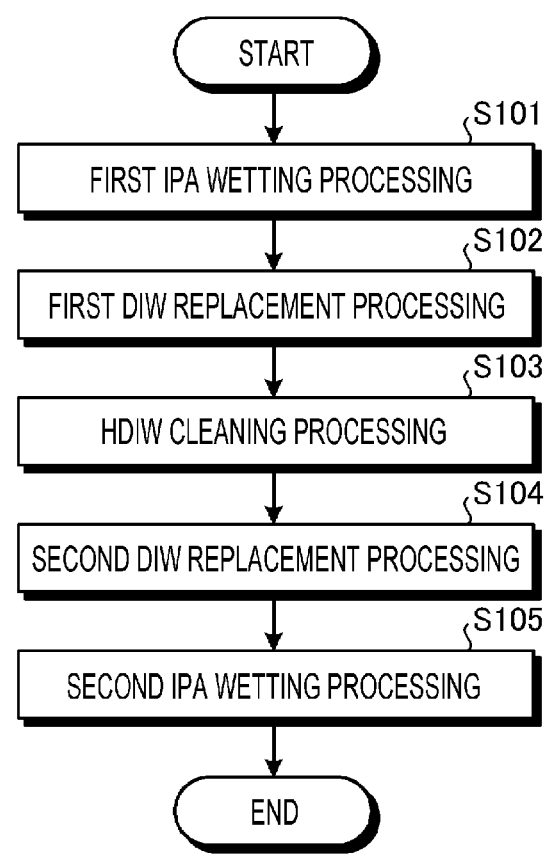
FIG. 4 is a flowchart illustrating an order of a processing performed by a filter cleaning system according to a first embodiment.
Figure 5:
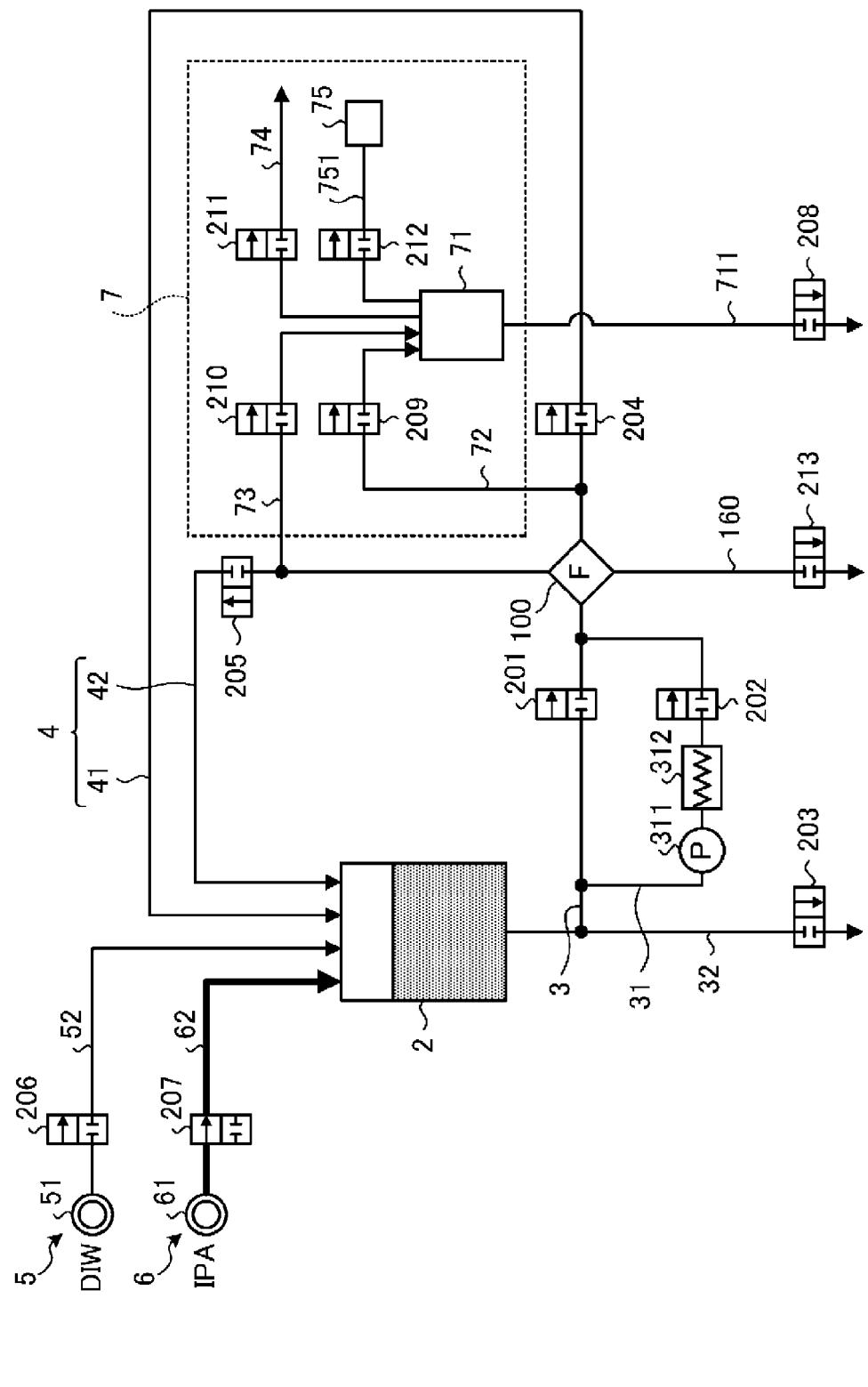
FIG. 5 is view illustrating a first IPA wetting processing.
Figure 6:
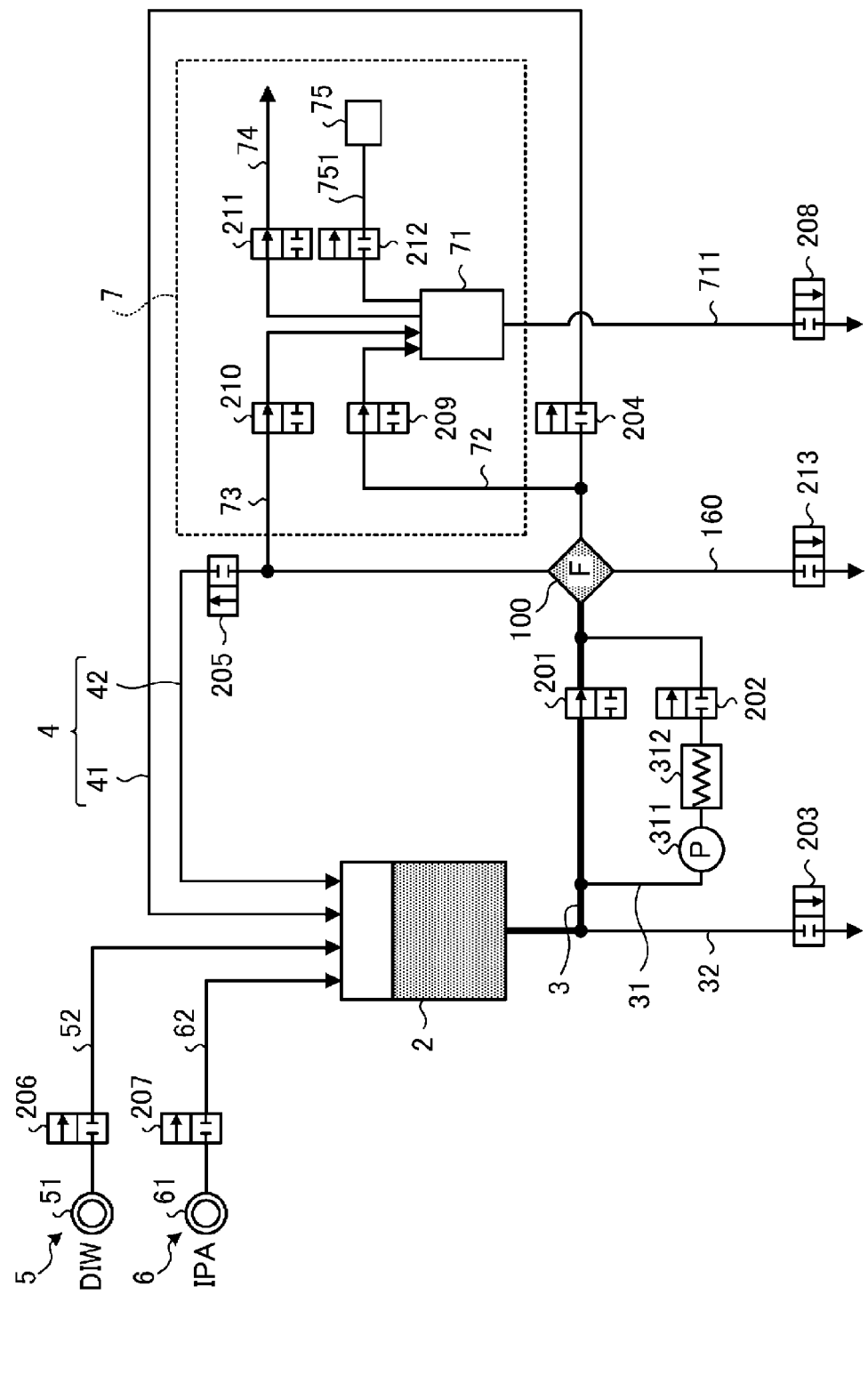
FIG. 6 is view illustrating the first IPA wetting processing.
Figure 7:
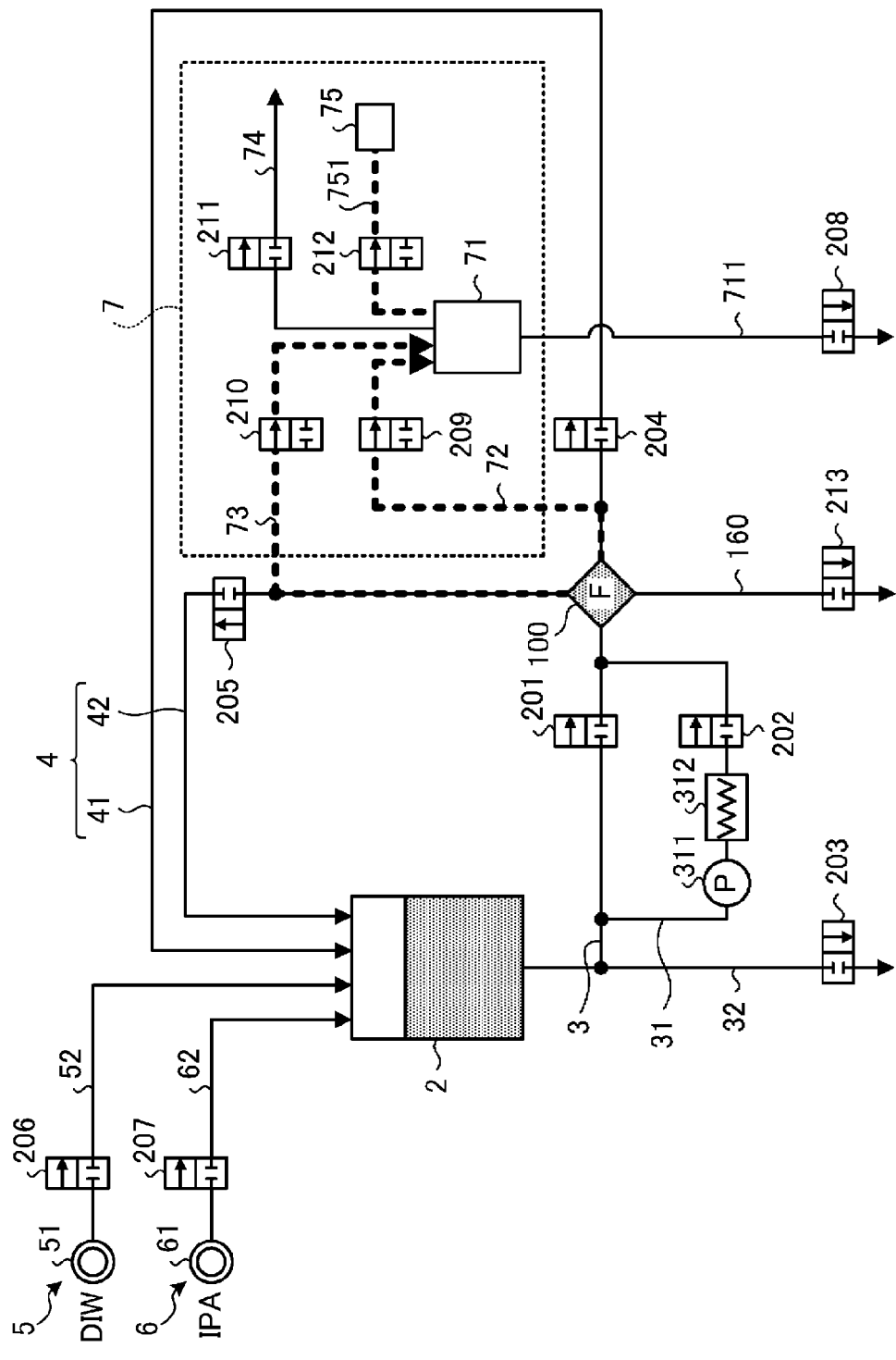
FIG. 7 is view illustrating the first IPA wetting processing.
Figure 8:
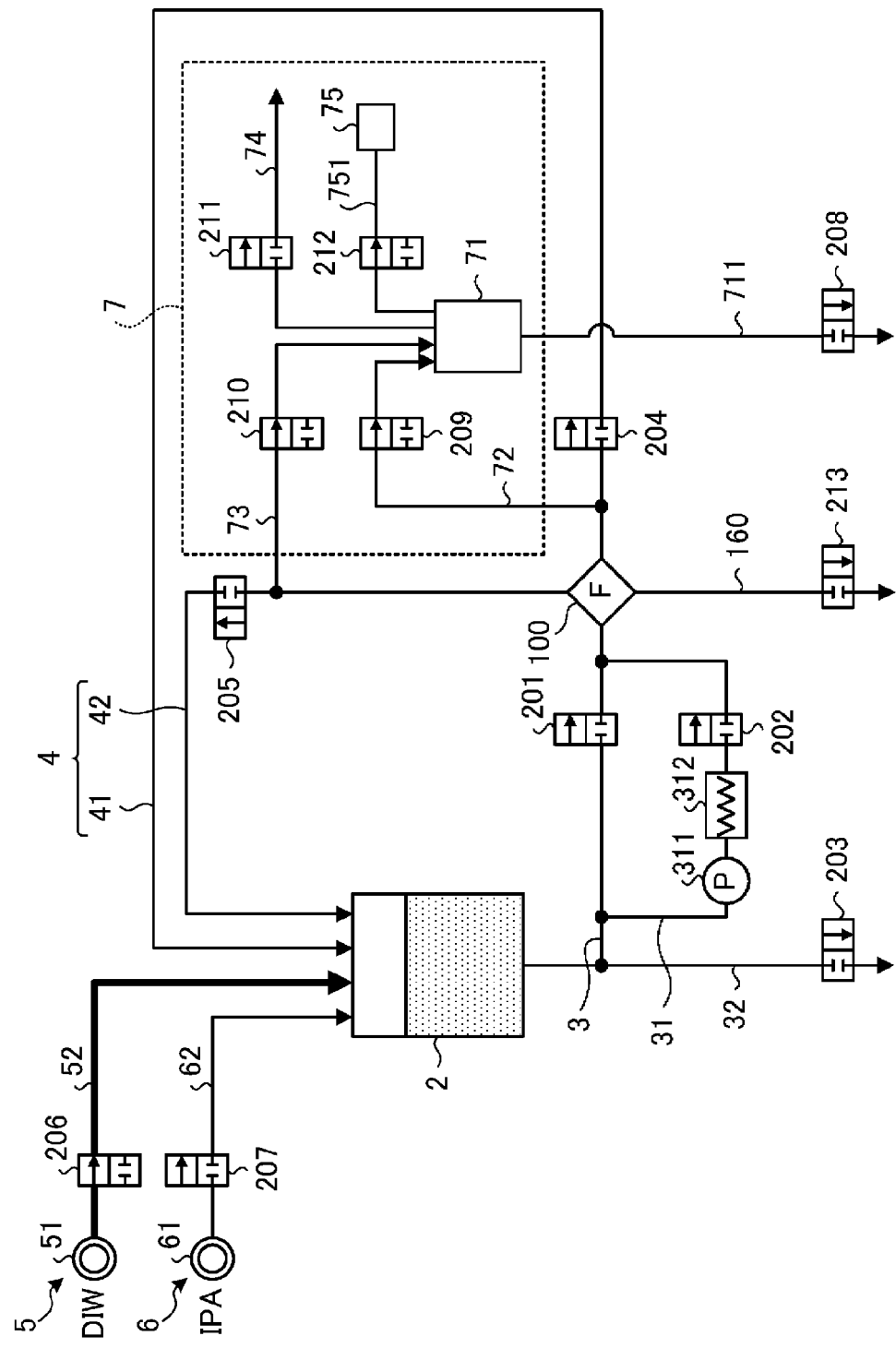
FIG. 8 is view illustrating a first DIW replacement processing.
Figure 9:
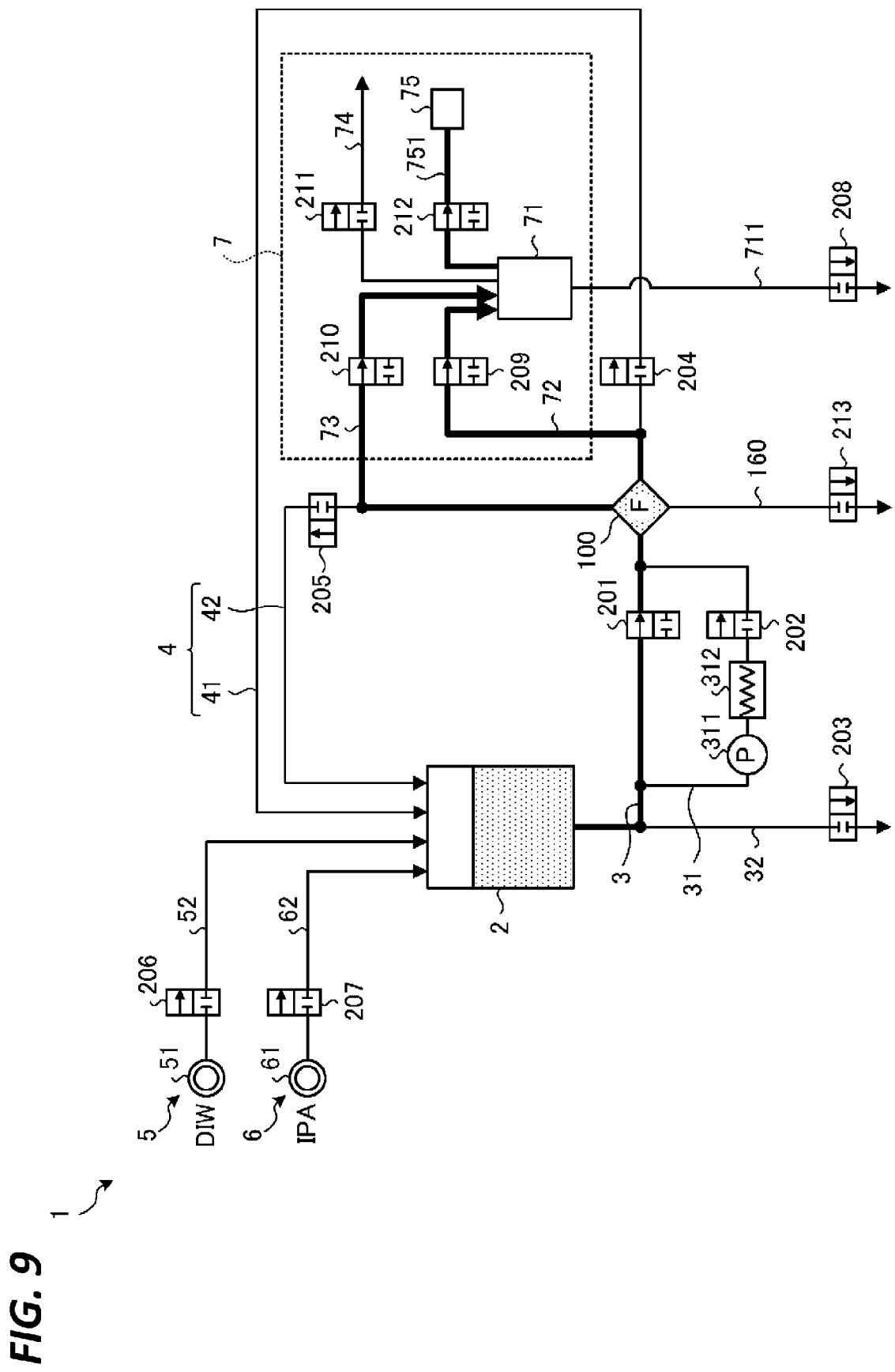
FIG. 9 is view illustrating the first DIW replacement processing.
Figure 10:
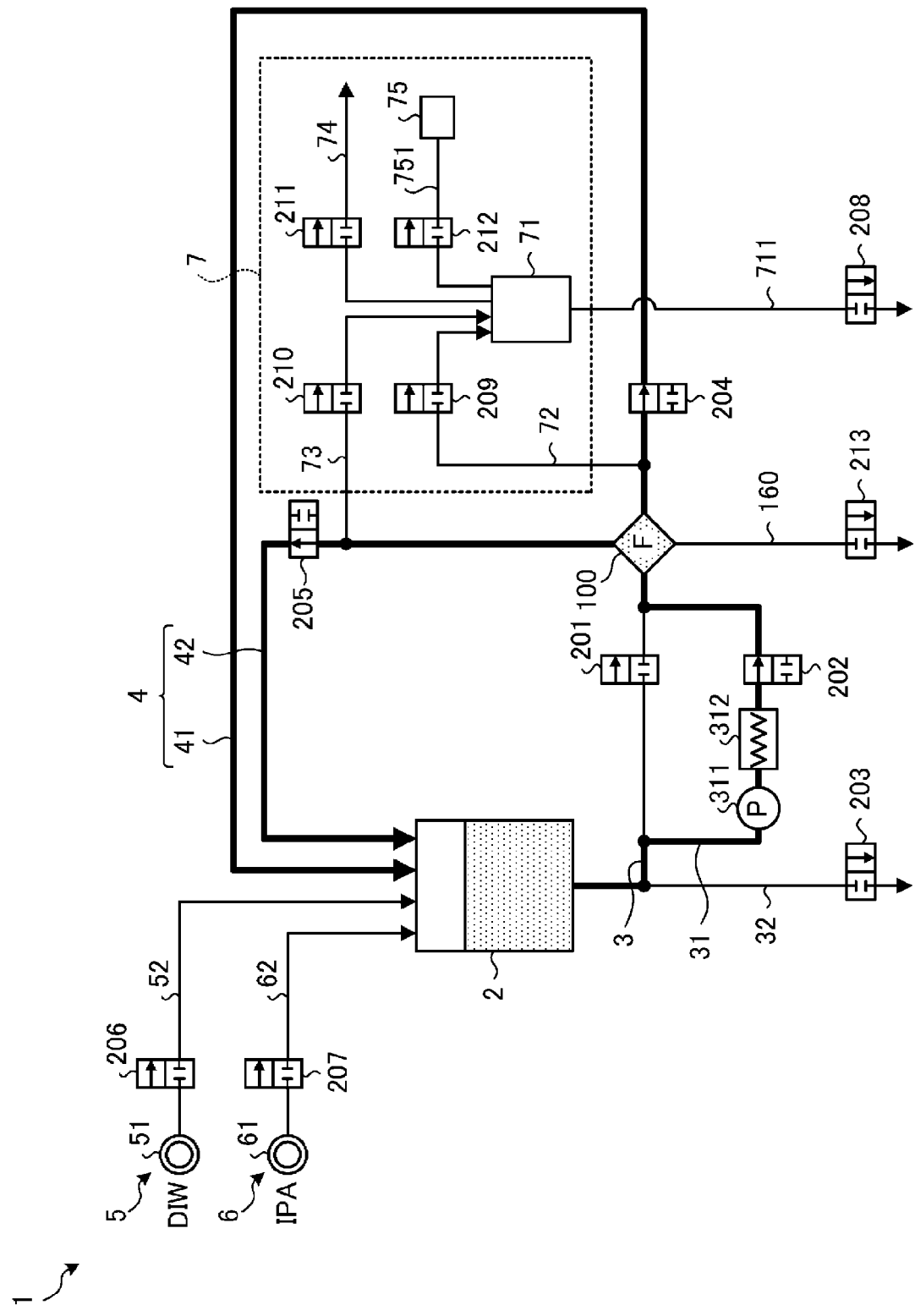
FIG. 10 is view illustrating an HDIW cleaning processing.

Next, a specific operation of the filter cleaning system 1 will be described with reference to FIGS. 4 to 10. FIG. 4 is a flowchart illustrating an order of a processing performed by the filter cleaning system 1 according to the first embodiment. FIGS. 5 to 7 are views illustrating a first IPA wetting processing, FIGS. 8 and 9 are views illustrating a first DIW replacement processing, and FIG. 10 is a view illustrating an HDIW cleaning processing. The order of each processing illustrated in FIG. 4 is performed according to the control of the control device 8.

[First IPA Wetting Processing]

As illustrated in FIG. 4, in the filter cleaning system 1, the first IPA wetting processing is performed at first (step S101).

In the first IPA wetting processing, firstly, the valve 207 is opened for a certain period of time, so that IPA is supplied from the second supply unit 6 to the storage unit 2. Therefore, the IPA is stored in the storage unit 2 (see FIG. 5). Thereafter, the valve 207 is closed, so that the supply of the IPA from the second supply unit 6 to the storage unit 2 is stopped. This processing may be performed before starting the first IPA wetting processing. That is, IPA may be stored in the storage unit 2 in advance. Further, the supply of the IPA from the second supply unit 6 to the storage unit 2 may be performed regularly or constantly during the first IPA wetting processing.

Subsequently, the valves 201, 209, 210, and 211 are opened. As described above, the filter 100 is disposed below the storage unit 2. Therefore, when the valves 201, 209, 210, and 211 are opened, the IPA stored in the storage unit 2 flows through the liquid supply path 3 and is introduced to the filter 100 by the own weight of the IPA. Therefore, the filter 100 is filled with the IPA. After the filter 100 is filled with the IPA, the valves 201 and 211 are closed.

As described above, in the filter cleaning system 1 according to the first embodiment, the inside of the filter 100 is filled with IPA at first. Since the IPA has a relatively low surface tension, specifically, lower than that of the DIW, it is suitable for wetting (hydrophilizing) the hydrophobic filtration membrane 110 (PTFE film) disposed inside the filter 100. Further, after once storing IPA in the storage unit 2, the IPA is supplied to the inside of the filter 100 by using the own weight of the IPA, and thus, for example, the gas dissolved in the IPA may be removed. Therefore, it is possible to shorten the time for a decompression degassing processing in the subsequent stage.

Here, an example of the second liquid used in the first IPA wetting processing is IPA. However, the second liquid may be any liquid as long as it has a surface tension lower than that of the first liquid (here, DIW) used in a processing in the subsequent stage, and has an affinity for the first liquid. As the second liquid, for example, an alcohol-based solvent such as methanol or ethanol may be used in addition to the IPA.

Subsequently, the valve 212 is opened, and the exhaust device 75 is driven. The exhaust device 75 sucks the inside of the filter 100 via the tank 71, the branch paths 72 and 73, and the circulation path 4. Therefore, the inside of the filter 100 is decompressed. This state is maintained for a predetermined time (e.g., 10 hours or more, furthermore, 15 hours or more).

As described above, the filter cleaning system 1 may degas the inside of the filter 100 by decompressing the inside of the filter 100. When air bubbles adhere to the filtration membrane 110 inside the filter 100, the IPA does not come into contact with the portion to which the air bubbles adhere, and thus, this portion becomes a dry spot that is not hydrophilized. Since the liquid does not pass through the dry spot, the effective membrane area of the filtration membrane 110 is reduced by the area of the dry spot.

With regard to this, according to the filter cleaning system 1, it is possible to suppress the dry spot from being formed in the filtration film 110 by degassing the inside of the filter 100, and thus, the filtration membrane 110 may be effectively hydrophilized.

Further, according to the filter cleaning system 1, by performing the first IPA wetting processing, the substances that are relatively easily dissolved in IPA among the contaminants contained in the filter 100 may be removed. As described above, the first IPA wetting processing also serves as cleaning of the filter 100.

[First DIW Replacement Processing]

Subsequently, a first DIW replacement processing is performed (step S102). Firstly, the valve 206 is opened for a certain period of time, so that DIW is supplied from the first supply unit 5 to the storage unit 2. Therefore, the DIW is stored in the storage unit 2 (see FIG. 8). The supply of the DIW from the first supply unit 5 to the storage unit 2 may be performed regularly or constantly during the first DIW replacement processing.

Subsequent to the first IPA wetting processing, in the first DIW replacement processing, the inside of the filter 100 is in a state of being decompressed by the decompression mechanism 7. The DIW stored in the storage unit 2 is passed through the filter 100 from the storage unit 2 via the liquid supply path 3 by the decompression mechanism 7. Therefore, the inside of the filter 100 is replaced with the DIW from the IPA (see FIG. 9). In the first DIW replacement processing, the time for passing the DIW through the filter 100 is, for example, approximately 10 minutes to 20 minutes.

As described above, in the filter cleaning system 1, the inside of the filter 100 is decompressed by the decompression mechanism 7 before the DIW is passed through the filter 100 in the first DIW replacement processing. Therefore, the replacement with the DIW from the IPA may be efficiently performed. Thereafter, the exhaust device 75 is stopped, the valve 212 is closed, and the valve 211 is opened. Therefore, the decompressed state of the inside of the filter 100 is released.

The replacement of the IPA may be performed by using HDIW (high-temperature DIW) used in an HDIW cleaning processing (to be described later). However, in this case, when HDIW is mixed with the IPA at room temperature, foaming may occur inside the filter 100. With regard to this, in the filter cleaning system 1, the replacement of the IPA is performed by using the DIW having the same temperature as the IPA, and thus, it is possible to suppress air bubbles from being generated again inside the filter 100 after degassing using the decompression mechanism 7.

[HDIW Cleaning Processing]

Subsequently, the HDIW cleaning processing is performed (step S103). In the HDIW cleaning processing, the valves 202, 204, and 205 are opened. Further, the pump 311 and the heating unit 312 are driven. Therefore, the DIW stored in the storage unit 2 circulates to the bypass path 31, and is heated by the heating unit 312. Then, the HDIW, which is the heated DIW, is passed through the filter 100. The HDIW passed through the filter 100 returns to the storage unit 2 via the first circulation path 41 and the second circulation path 42.

The temperature of the HDIW is equal to or higher than the operating temperature of the processing liquid (IPA) passed through the filter 100 in the substrate liquid processing apparatus. The HDIW passed through the filter 100 returns to the storage unit 2 via the first circulation path 41 and the second circulation path 42.

By passing the HDIW through the filter 100, the metal components that are almost insoluble in IPA (in other words, dissolved in an extremely small amount) among the contaminants included in the filter 100 can be removed.

In the HDIW cleaning processing, the time for passing the HDIW through the filter 100 is 24 hours or more. Further, the flow rate of the HDIW in the HDIW cleaning processing may be larger than the flow rate of the DIW in the first DIW replacement processing. The flow rate of the HDIW (or DIW) may be adjusted by a flow rate adjusting mechanism (not illustrated).

[Second DIW Replacement Processing]

Subsequently, a second DIW replacement processing is performed (step S104). In the second DIW replacement processing, the pump 311 and the heating unit 312 are stopped. Further, by opening the valves 203 and 213 for a certain period of time, the HDIW used in the HDIW cleaning processing is discharged from the storage unit 2 and the filter 100.

Thereafter, the valve 206 is opened, so that the new liquid of DIW is supplied from the first supply unit 5 to the storage unit 2. Thereafter, the valves 201, 209, 210, and 212 are opened, and the exhaust device 75 of the decompression mechanism 7 is driven. Therefore, the DIW stored in the storage unit 2 is passed through the filter 100 by the same order as in the first DIW replacement processing, that is, by the same route as in FIG. 9. As a result, the HDIW remaining inside the filter 100 is replaced with the DIW. In the second DIW replacement processing, the time for passing the DIW through the filter 100 is, for example, approximately 10 minutes to 20 minutes.

In the second DIW replacement processing, the DIW may be passed through the filter 100 by the same order as in the HDIW cleaning processing, that is, by the same route as in FIG. 10.

As described above, by replacing the HDIW used in the HDIW cleaning processing with the new liquid of DIW, it is possible to suppress the contaminants removed from the filter 100 by the HDIW from adhering to the filter 100 again.

Further, by performing the second DIW replacement processing, in a second IPA wetting processing in the subsequent stage, it is possible to suppress foaming at the time of mixing as compared with the case where the HDIW is replaced with the IPA.

[Second IPA Wetting Processing]

Subsequently, the second IPA wetting processing is performed (step S105). In the second IPA wetting processing, the filter 100 is filled with the IPA by the same order as in the first IPA wetting processing, and then, the inside of the filter 100 is decompressed.

As described above, by performing the second IPA wetting processing, it is possible to suppress water from remaining inside the filter 100. Therefore, it is possible to suppress an increase in the water concentration when the apparatus is in operation.

A series of the filter cleaning processing described above may be ended in a state where the IPA (the processing liquid passed through the filter 100 in the substrate liquid processing apparatus in which the filter 100 is mounted) is sealed inside the filter 100. Further, a series of the filter cleaning processing described above may be ended in a state where, after the IPA is discharged from the filter 100, the inside of the filter 100 is dried by using, for example, $N_2$ gas.

Second Embodiment

Figure 11:
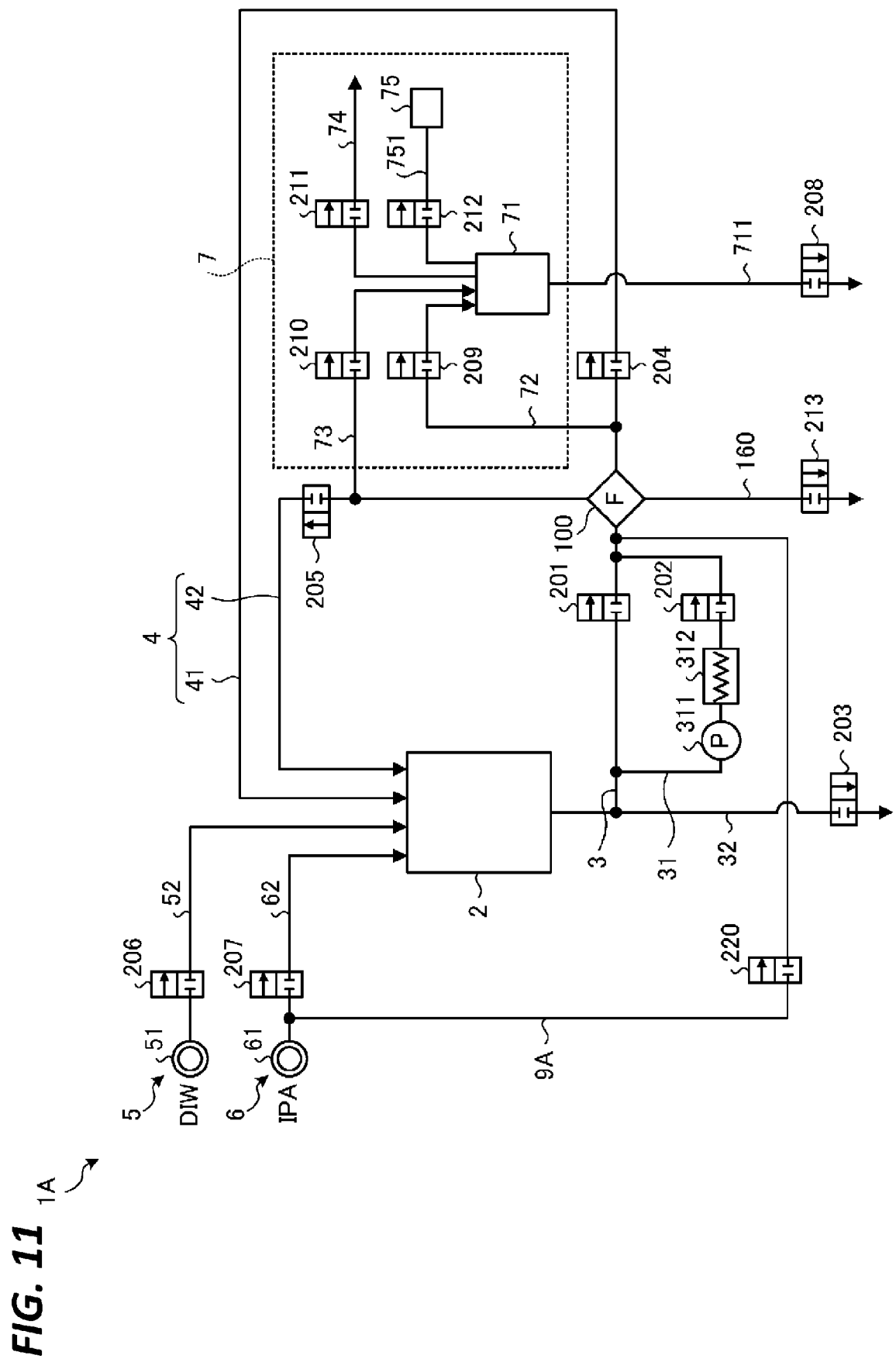
FIG. 11 is a view illustrating a configuration of a filter cleaning system according to a second embodiment.

Next, a configuration of a filter cleaning system according to a second embodiment will be described with reference to FIG. 11. FIG. 11 is a view illustrating the configuration of the filter cleaning system according to the second embodiment. In FIG. 11, the control device 8 is omitted.

As illustrated in FIG. 11, a filter cleaning system 1A according to the second embodiment further includes a branch path 9A. The branch path 9A is a conduit that connects the second supply path 62 of the second supply unit 6 and the liquid supply path 3 with each other. Specifically, one end of the branch path 9A is connected to the second supply path 62 on the upstream side from the valve 207. Further, the other end of the branch path 9A is connected to the liquid supply path 3 on the downstream side from the valve 201. A valve 220 that opens/closes the branch path 9A is provided in the branch path 9A.

In the filter cleaning system 1A according to the second embodiment, the first IPA wetting processing and the second IPA wetting processing are performed using the branch path 9A. Specifically, by opening the valve 220 for a certain period time, IPA is supplied to the filter 100 from the IPA supply source 61 via the branch path 9A and the liquid supply path 3 by pumping by the IPA supply source 61.

As described above, in the filter cleaning system 1A, the first IPA wetting processing and the second IPA wetting processing may be performed without storing the IPA in the storage unit 2. As a result, according to the filter cleaning system 1A, the time required for the first IPA wetting processing and the second IPA wetting processing may be shortened.

Further, it may not be desirable to mix the first liquid (here, DIW) and the second liquid (here, IPA) in the storage unit 2. By using the branch path 9A in this case, it is possible to prevent the first liquid and the second liquid from being mixed with each other in the storage unit 2.

Modification

In the embodiments described above, after finishing the second DIW replacement processing, the wetting processing using IPA is performed. However, the liquid used in the wetting processing after the second DIW replacement processing may be a processing liquid that is passed through the filter 100 when the substrate liquid processing apparatus in which the filter 100 is mounted is operated, and does not necessarily have to be IPA. In this case, the filter cleaning systems 1 and 1A may include, for example, a processing liquid supply unit that supplies the processing liquid passed through the filter 100 when the substrate liquid processing apparatus is operated to the storage unit 2. When the processing liquid is IPA, the processing liquid supply unit corresponds to the second supply unit 6 described above.

As described above, the filter cleaning system (as examples, filter cleaning systems 1 and 1A) according to the embodiment includes the storage unit (as an example, storage unit 2), the liquid supply path (as examples, liquid supply paths 3 and 3A), the circulation path (as an example, circulation path 4), the first supply unit (as an example, first supply unit 5), and the second supply unit (as an example, second supply unit 6). The storage unit stores the liquid passed through the filter (as an example, filter 100). The liquid supply path sends the liquid stored in the storage unit to the filter. The circulation path returns the liquid sent from the filter to the storage unit. The first supply unit supplies the first liquid (as an example, DIW) to the storage unit. The second supply unit supplies the second liquid (as an example, IPA) having a surface tension lower than that of the first liquid and an affinity for the first liquid to the storage unit. Therefore, according to the filter cleaning system according to the embodiments, it is possible to effectively clean the filter before being used in the substrate liquid processing apparatus.

The filter cleaning system according to the embodiments may include the decompression mechanism (as an example, decompression mechanism 7). The decompression mechanism 7 is connected to the circulation path, and decompresses the inside of the filter via the circulation path. Therefore, the inside of the filter may be degassed, and it is possible to suppress the dry spot from occurring on the filtration membrane disposed inside the filter.

The filter cleaning system according to the embodiments may include the controller (as an example, control unit 81). The controller controls the first supply unit, the second supply unit, and the decompression mechanism. Further, the controller performs the decompression processing (as an example, first IPA wetting processing), and the replacement processing with the first liquid (as an example, first DIW replacement processing). The decompression processing is a processing in which the decompression mechanism is controlled to decompress the inside of the filter in a state where the filter is filled with the second liquid. The replacement processing with the first liquid is a processing in which, after the decompression processing is completed and the second liquid is discharged from the filter, the first supply unit is controlled to store the first liquid in the storage unit, and the stored first liquid is passed through the filter so that the inside of the filter is replaced with the first liquid. Therefore, the substances that are difficult to be removed by the second liquid among the contaminants included in the filter may be removed by using the first liquid.

The controller may decompress the inside of the filter using the decompression mechanism from before the first liquid is passed through the filter and throughout during the passage of the first liquid through the filter. Therefore, the replacement with the first liquid from the second liquid may be efficiently performed. Further, it is possible to suppress foaming from occurring inside the filter as compared with the case where the first liquid is supplied to the filter by pressurization.

The liquid supply path may include the bypass path (as an example, bypass path 31) that is branched from the liquid supply path and returns to the liquid supply path. Further, the bypass path may include the heating unit (as an example, heating unit 312). In this case, in the replacement processing, the decompression mechanism may be stopped, and then, the first liquid may be circulated to the bypass path and the first liquid (as an example, HDIW) heated by the heating unit may be passed through the filter. Therefore, the substances that are difficult to be removed by the second liquid among the contaminants included in the filter may be effectively removed. Further, before the heated first liquid is supplied, the second liquid is replaced with the unheated first liquid, and thus, it is possible to suppress foaming inside the filter.

The filter cleaning system according to the embodiments may include the processing liquid supply unit (in a case where the processing liquid is IPA, as an example, first supply unit 6). The processing liquid supply unit supplies the processing liquid passed through the filter when the substrate liquid processing apparatus is in operation to the storage unit. In this case, after the replacement with the first liquid is completed and the first liquid is discharged from the filter, the controller controls the processing liquid supply unit to store the processing liquid in the storage unit, and passes the stored processing liquid through the filter. Therefore, for example, when the first liquid is DIW, it is possible to suppress an increase in water concentration of the processing liquid used in the substrate liquid processing apparatus.

The filter cleaning system according to the embodiments may include the branch path (as an example, branch path 9A) that is branched from the second supply unit and is connected to the liquid supply path. Therefore, it is unnecessary to store the second liquid in the storage unit, and thus, the processing time may be shortened.

It should be considered that the embodiments disclosed in here are illustrative in all aspects and not restrictive. In practice, the above embodiments can be realized in various forms. Further, the above embodiments may be omitted, replaced, or changed in various forms without departing from the scope of the attached claims and the purpose thereof.

DESCRIPTION OF SYMBOLS

1: filter cleaning system
2: storage unit
3: liquid supply path
4: circulation path
5: first supply unit
6: second supply unit
7: decompression mechanism
8: control device
31: bypass path
32: drain path
41: first circulation path
42: second circulation path
51: DIW supply source
52: first supply path
61: IPA supply source
62: second supply path
71: tank
72, 73: branch path
74: atmospheric open path
75: exhaust device
100: filter
110: filtration membrane
120: introducing port
130: sending port
140: vent port
150: drain port
160: drain path
311: pump
312: heating unit

What is claimed is:

1. A filter cleaning system for cleaning a filter having an inside, the filter cleaning system comprising:
a storage configured to store liquid that is passed through the filter;
a liquid supply path configured to send the liquid stored in the storage to the filter, wherein the liquid supply path includes a bypass path that is branched from the liquid supply path and returns to the liquid supply path;
a circulation path that returns the liquid sent from the filter to the storage;
a first supply source connected to the storage, the first supply source having a first liquid;
a second supply source connected to the storage, the second supply source having a second liquid with a surface tension lower than that of the first liquid and an affinity for the first liquid,
a decompressor connected to the circulation path; and
a controller configured to control the first supply source, the second supply source, and the decompressor,
wherein the controller is configured to selectively cause the decompressor to:
decompress an inside of the filter by sucking the inside of the filter and complete the decompression before the first liquid is passed through the filter; or
decompress the inside of the filter by sucking the inside of the filter throughout the passage of the first liquid through the filter;
and selectively replace a fluid communication of the second liquid source with the storage with a fluid communication of the first liquid source with the storage.

2. The filter cleaning system according to claim 1, wherein the controller is configured to:
control the second supply source to supply the second liquid to the storage and pass the second liquid stored in the storage through the filter so as to fill the filter with the second liquid, and
after a predetermined time has elapsed in a state where the filter is filled with the second liquid, control the first supply source to supply the first liquid to the storage and pass the first liquid stored in the storage through the filter so as to replace the inside of the filter with the first liquid.

3. The filter cleaning system according to claim 2, wherein:
the bypass path includes a heater, and
during the replacing, the controller is further configured to stop the decompression, and then, circulate the first liquid to the bypass path and pass the first liquid heated by the heater through the filter.

4. The filter cleaning system according to claim 3, further comprising:
a processing liquid supply configured to supply a processing liquid that is passed through the filter to the storage during operation of a substrate liquid processing apparatus mounted with the filter,
wherein, after the replacement with the first liquid is completed or is stopped after passage of the first liquid through the filter, and the first liquid is discharged from the filter, the controller is configured to control the processing liquid supply to store the processing liquid in the storage and pass the processing liquid stored in the storage through the filter.

5. The filter cleaning system according to claim 1, further comprising:
a processing liquid supply configured to supply a processing liquid that is passed through the filter to the storage during operation of a substrate liquid processing apparatus mounted with the filter,
wherein, after the replacement with the first liquid is completed or is stopped after passage of the first liquid through the filter, and the first liquid is discharged from the filter, the controller is configured to control the processing liquid supply to store the processing liquid in the storage and pass the processing liquid stored in the storage through the filter.

6. The filter cleaning system according to claim 1, further comprising:
  a branch path branched from the second supply source and connected to the liquid supply path.

7. A filter cleaning method comprising:
  filling a filter having an inside with a second liquid having a surface tension lower than that of a first liquid and an affinity for the first liquid by passing the second liquid through the filter;
  after the filling with the second liquid is completed and the second liquid is discharged from the filter, replacing the second liquid in the inside of the filter with the first liquid by storing the first liquid in a storage connected to the filter via a liquid supply path including a bypass path that is branched from the liquid supply path and returns to the liquid supply path and passing the first liquid stored in the storage through the filter; and
  decompressing the inside of the filter by sucking the second liquid in the inside of the filter selectively followed by:
    completing the decompression before the first liquid is passed through the filter; or
    decompressing the inside of the filter throughout during the passage of the first liquid through the filter.

8. The filter cleaning method according to claim 7, wherein, after the decompression is completed or is stopped after passage of the first liquid through the filter, circulating the first liquid to the bypass path, and heating the first liquid by a heater provided in the bypass path.

9. The filter cleaning method according to claim 7, further comprising:
  supplying a processing liquid that is passed through the filter to the storage during operation of a substrate liquid processing apparatus mounted with the filter, and
  after the replacement with the first liquid is completed or is stopped after passage of the first liquid through the filter, and the first liquid is discharged from the filter, storing the processing liquid in the storage and passing the processing liquid stored in the storage through the filter.

* * * * *